United States Patent [19]
Fung et al.

[11] Patent Number: 5,189,319
[45] Date of Patent: Feb. 23, 1993

[54] POWER REDUCING BUFFER/LATCH CIRCUIT

[75] Inventors: Wingcho Fung, Fremont; Krishna M. Yellamilli, San Jose, both of Calif.

[73] Assignee: Intel Corporation, Santa Clara, Calif.

[21] Appl. No.: 774,219

[22] Filed: Oct. 10, 1991

[51] Int. Cl.[5] .................. H03K 19/096; H03K 19/20
[52] U.S. Cl. .................... 307/452; 307/481; 307/453
[58] Field of Search ............ 307/452, 453, 481, 594, 307/272.1-272.3, 279; 365/203

[56] References Cited

U.S. PATENT DOCUMENTS

| | | | |
|---|---|---|---|
| 4,451,745 | 5/1984 | Itoh et al. | 307/481 |
| 4,496,852 | 1/1985 | Blaser et al. | 307/481 |
| 4,700,086 | 10/1987 | Ling et al. | 307/452 |
| 4,876,465 | 10/1989 | Podkowa et al. | 307/452 |
| 4,983,860 | 1/1990 | Yim et al. | 307/443 |
| 5,003,501 | 3/1991 | Podkowa | 364/569 |

Primary Examiner—Edward P. Westin
Assistant Examiner—Andrew Sanders
Attorney, Agent, or Firm—Blakely, Sokoloff, Taylor & Zafman

[57] ABSTRACT

A data latch/buffer cell for driving a data bus line conditionally precharges the line only during cycles prior those in which data is actually sampled. An input gate selectively enables a data input signal for application to a latching circuit. Prior to application of the data input, a conditional precharge signal is applied to the latch circuit to clear the previously latched data. A latch circuit is coupled to the gate of a pull-down transistor which drives the data bus. The conditional precharge signal is also coupled to the gate of a complementary pull-up transistor to precharge the bus line. Application of the conditional precharge signal to the gate of the pull-up transistor is delayed relative to turning off the pull-down transistor to preclude a rush through current in the driver.

5 Claims, 1 Drawing Sheet

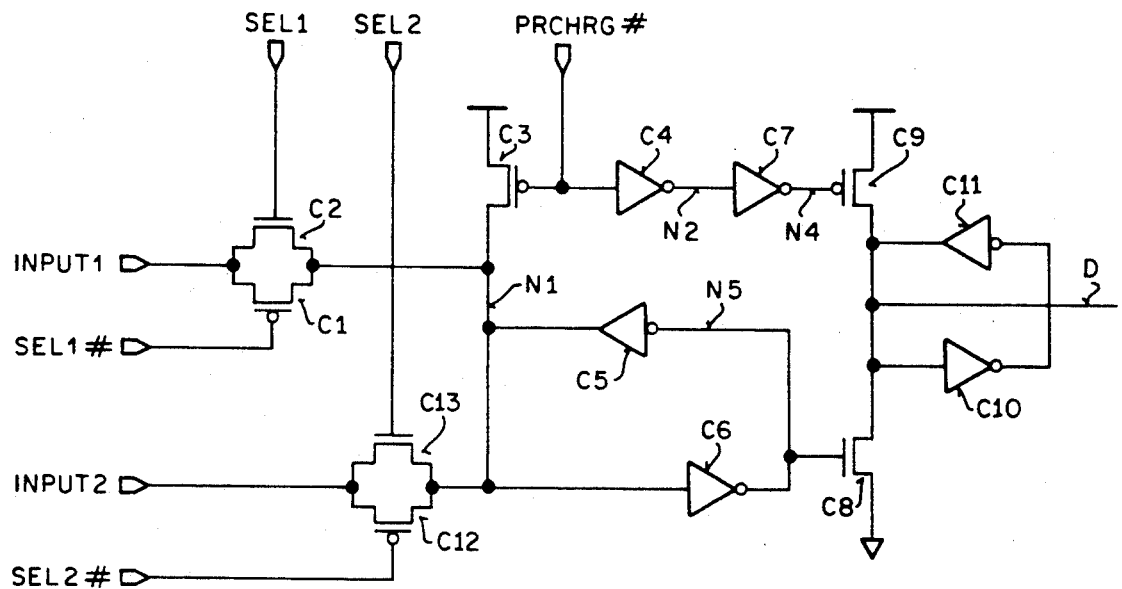
FIG_1
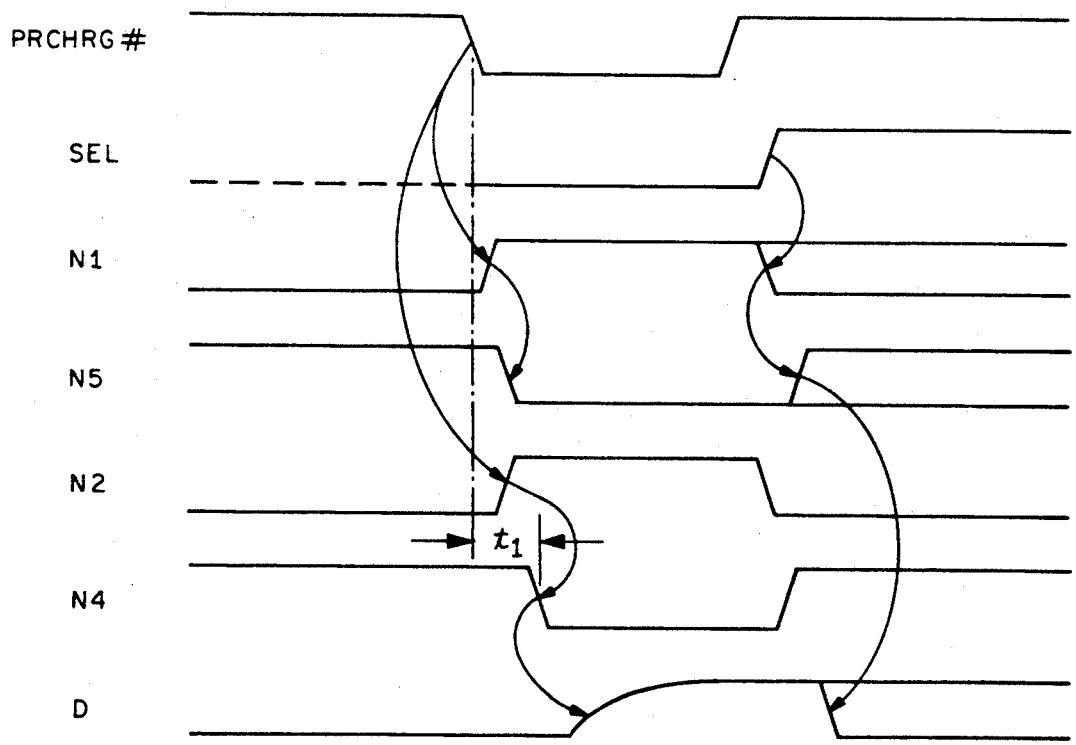
FIG_2

POWER REDUCING BUFFER/LATCH CIRCUIT

FIELD OF THE INVENTION

This invention relates to the field of microprocessor and peripheral device design, and particularly to a data output buffer/latch for driving a data bus.

BACKGROUND OF THE INVENTION

Drivers for data bus outputs of a typical CMOS VLSI semiconductor device use a bi-phase precharge/evaluate scheme for applying data to the bus. That is, the bus output is precharged to a voltage level substantially above ground prior to enabling data on the bus line. In this manner, the bus line capacitance is charged during the precharge phase to reduce the propagation delay during the evaluation phase.

In many applications, the precharge/evaluation cycle is governed by cyclical control signals such that precharging of the bus line occurs repeatedly whether or not data is subsequently applied to the line or is read by a receiving device. Consequently, a significant amount of power may be wasted during those cycles in which the bus line is not sampled. Furthermore, in places where the fanout and speed requirements of a bus are critical, the bi-phase precharge/evaluate scheme requires extensive latching and buffering, thereby increasing the device count, device sizes and the number of logic stages.

To overcome these disadvantages of cyclically precharging a data bus, schemes have been devised for precharging a bus line less frequently. For example, U.S. Pat. No. 4,983,860 discloses a data output buffer that is precharged under the control of a signal developed in an address transition detection circuit. U.S. Pat. No. 5,003,501 discloses a low power integrated circuit in which charging and discharging of a data bus occurs only when there is a data transition.

The present invention reduces power dissipation of a data bus driver by precharging the bus line only when necessary. Conventional bi-phase timing signals are retained; however, precharging of the data bus lines is performed only during the cycle prior to the one in which data sampling actually occurs. At all other times, a simple latch holds the data.

SUMMARY OF THE INVENTION

The present invention provides a compact cell for integrated circuits comprising a data latch and buffer which is conditionally precharged only during cycles prior to those in which data is actually sampled. An input gate selectively enables a data input signal for application to a latching circuit. Prior to application of the data input, a conditional precharge signal is applied to the latch circuit to clear the previously latched data. A latch circuit is coupled to the gate of a pull-down transistor which drives the data bus. The conditional precharge signal is also coupled to the gate of a complementary pull-up transistor to precharge the bus line. Application of the conditional precharge signal to the gate of the pull-up transistor is delayed relative to turning off the pull-down transistor to preclude a rush through current in the driver.

The invention is advantageously employed in conjunction with a conventional microprocessor whose data outputs have a conventional bi-phase precharge/evaluate scheme. A latch/buffer cell as hereinafter described is coupled between a microprocessor data output and the corresponding bus line so that the bus line is precharged only on an as needed basis.

BRIEF DESCRIPTION OF THE DRAWINGS

FIG. 1 is a schematic diagram of a buffer circuit according to the present invention.

FIG. 2 is a timing diagram illustrating the operation of the circuit of FIG. 1.

DETAILED DESCRIPTION OF THE INVENTION

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods, devices and circuits are omitted so as not to obscure the description of the present invention with unnecessary detail.

Referring to FIGS. 1, a simplified circuit diagram of a preferred embodiment of the present invention is shown. An input signal INPUT 1 is applied at the source terminals of transistors C1 and C2. In the preferred embodiment of this invention, signal INPUT 1 is a conventional data bus output of a microprocessor. An enable or selection signal SEL 1 is asserted at the gate terminal of transistor C2 and its complement SEL 1 # is asserted at the gate terminal of transistor C1. The drain terminals of transistors C1 and C2 are both coupled to node N1.

A negative logic conditional precharge signal PRCHRG# is generated in logic circuitry (not shown) in accordance with conditions determined by the data timing parameters of the particular system in which the invention is implemented. For example, PRCHRG# may be generated so as to precharge data bus output D only on selected cycles of a conventional precharge timing signal such that precharging will be performed in synchronism with bus cycle instructions.

Signal PRCHRG# is asserted at the gate terminal of transistor C3, whose source terminal is coupled to the supply voltage. The drain terminal of transistor C3 is coupled to node N1, i.e., in common with the drain terminals of transistors C1 and C2.

Also coupled to node N1 is the input of inverter C6, the output of which is coupled to node N5. The input of inverter C5 is also coupled to node N5 to form a latch in combination with inverter C6. Node N5 is also tied to the gate terminal of transistor C8.

Signal PRCHRG# is asserted at the input of inverter C4 whose output, identified as node N2, is coupled to the input of inverter C7. The output of inverter C7, node N4, is coupled to the gate terminal of transistor C9. The source terminal of transistor C9 is coupled to the supply voltage and the drain terminal of C9 is coupled to node D as is the drain terminal of transistor C8. The source terminal of C8 is coupled to ground and, as mentioned above, the gate terminal is coupled to node N5.

Inverters C10 and C11 are coupled input to output around node D to form a keeper circuit.

FIG. 1 illustrates a second input signal INPUT 2 coupled to the source terminals of transistors C12 adn C13. The drain terminals of C12 and C13 are coupled to node N1 in common with the drain terminals of C1 and C2. A second enable or selection signal SEL2 is asserted at the gate terminal of transistor C13 and its complement SEL2# is asserted at the gate terminal of transistor C12.

It will be recognized that transistors C8 and C9 should be sized in accordance with the anticipated loading on output node D. In this manner, latch/buffer cells of various load ratings may be constructed according to this invention to accommodate a range of fanout requirements.

Referring now to FIG. 2, the detailed operation of the above-described circuit will be explained. As mentioned above, signal PRCHRG# is developed by logic circuitry so that precharging of the bus lines is performed only on an as-needed basis. Thus, precharging is preferably synchronized with the data bus cycle.

A transition of signal PRCHRG# from high to low initiates the precharge phase. This turns on transistor C3 bringing node N1 to high. When node N1 is driven high, inverter C6 drives node N5 low, thereby turning off transistor C8. Selection signals SEL1 and SEL 2 are maintained low during precharge to avoid contention at node N1.

Signal PRCHRG# propagates through inverters C4 and C7 such that node N4 is driven low following the transition of PRCHRG# by a delay of $t_1$. The characteristics of inverters C4 and C7 are selected so that delay time $t_1$ is sufficiently long to guarantee that node N4 cannot go low before node N5 goes low. This ensures that transistors C8 and C9 will not be on simultaneously so as to provide a high current path between the supply voltage and ground.

When node N4 is driven low, transistor C9 is turned on, allowing node D to charge up the line capacitance coupled thereto. PRCHRG# is maintained low for at least a sufficient time for node D to precharge to a voltage at which the keeper circuit comprising inverters C10 and C11 will maintain node D at a logical high level. Thereafter, PRCHRG# returns to a high level turning off transistor C3 and, delay time $t_1$ later, transistor C9 turns off. With C8 and C9 both off, node D is maintained high by C10 and C11.

One of the input signals SEL1 and SEL2 is then set high to enable the respective input latch C1/C2 or C12/C13. The output of the selected latch is asserted at node N1 which then either remains high if the selected input is high or is driven low if the selected input is low.

If the selected input is low, node N5 will be driven high, turning on transistor C8 and discharging node D to ground. Otherwise C8 remains off and node D remains high.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

We claim:

1. A buffer circuit comprising:
   output driver means for generating a data output signal, the output driver means including a first transistor for driving the data output signal to a first voltage level and a second transistor for driving the data output signal to a second voltage level;
   keeper circuit means coupled to the output driver means for maintaining the data output signal at one of the first and second voltage levels when both the first and second transistors are turned off;
   latch means coupled to a gate terminal of the first transistor for maintaining a gate voltage;
   precharge circuit means coupled to the latch means and the output driver means for turning off the first transistor and turning on the second transistor, thereby forcing the data output signal to the second voltage level;
   gate means coupled to the latch means for selectively coupling a data input signal to the gate terminal of the first transistor.

2. The buffer circuit of claim 1 wherein the precharge circuit means includes delay means so that the second transistor is turned on after the first transistor is turned off.

3. The buffer circuit of claim 1 further comprising a second gate means coupled to the latch means from selectively coupling a second data input signal to the gate terminal of the first transistor.

4. The buffer circuit of claim 1 wherein the precharge circuit means comprises a third transistor for selectively resetting the latch means and thereby turning off the first transistor.

5. The buffer circuit of claim 4 wherein the latch means comprises first and second inverters coupled between the third transistor and the gate terminal of the first transistor.

* * * * *